(12) United States Patent
Denkberg et al.

(10) Patent No.: US 10,929,584 B1
(45) Date of Patent: Feb. 23, 2021

(54) ENVIRONMENTAL MODIFICATION TESTING FOR DESIGN CORRECTNESS WITH FORMAL VERIFICATION

(71) Applicant: Amazon Technologies, Inc., Seattle, WA (US)

(72) Inventors: Benzi Denkberg, Etz Efraim (IL); Uri Leder, Lotem (IL); Ori Weber, Tel Aviv (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/712,933

(22) Filed: Dec. 12, 2019

(51) Int. Cl.
*G06F 30/33* (2020.01)
*G06F 5/06* (2006.01)
*G06F 30/3323* (2020.01)

(52) U.S. Cl.
CPC ............ *G06F 30/3323* (2020.01); *G06F 5/06* (2013.01)

(58) Field of Classification Search
CPC .............................. G06F 5/06; G06F 30/3323
USPC .................................................. 716/101, 111
See application file for complete search history.

(56) References Cited

U.S. PATENT DOCUMENTS

| 5,978,574 | A | 11/1999 | Sharma |
| 6,074,426 | A * | 6/2000 | Baumgartner et al. ...................... G06F 30/3323 703/13 |
| 7,310,790 | B2 * | 12/2007 | Melham et al. .... G06F 30/3323 716/103 |
| 7,475,369 | B1 * | 1/2009 | Lam et al. .......... G06F 30/3323 716/106 |
| 9,689,921 | B2 | 6/2017 | Hamid et al. |
| 2018/0113976 | A1 | 4/2018 | Suresh et al. |

* cited by examiner

*Primary Examiner* — Sun J Lin
(74) *Attorney, Agent, or Firm* — Robert C. Kowert; Kowert, Hood, Munyon, Rankin & Goetzel, P.C.

(57) ABSTRACT

Environmental modification testing with a formal verification is implemented for language-specified hardware designs. A language-specified hardware design may be received. A reference copy of the language-specified hardware design may be created. A formal verification may be performed on both the language-specified hardware design and the reference copy with a same input data. Different environmental assumptions for processing the same input data through the reference copy and the language-specified hardware design may be applied. An output value of the language-specified hardware design may be compared with an output value of the reference copy to determine whether those output values match. Error indications may be provided based on a result of the comparison.

20 Claims, 7 Drawing Sheets

ENVIRONMENTAL MODIFICATION TESTING FOR DESIGN CORRECTNESS WITH FORMAL VERIFICATION

BACKGROUND

Formal verification provides a cost effective design tool when implementing different hardware solutions. A formal verification system may generate a mathematical model or representation of a hardware design, then determine whether a proof exists or can be generated that solves the mathematical model (e.g., by providing a proof to demonstrate correctness of a finite state machine). If a proof exists, then it can be assured that the hardware design is logically sound (although further testing for physical implementation features, such as component layout to account for On-Chip Variation and other physically occurring conditions may still be performed). In this way, problems in the hardware design can be identified. Techniques that can increase the utilization of formal verification systems may reduce design and development costs, decrease the number of undetected bugs, errors, or design flaws, and thus such techniques may be highly desirable.

Figure 1:
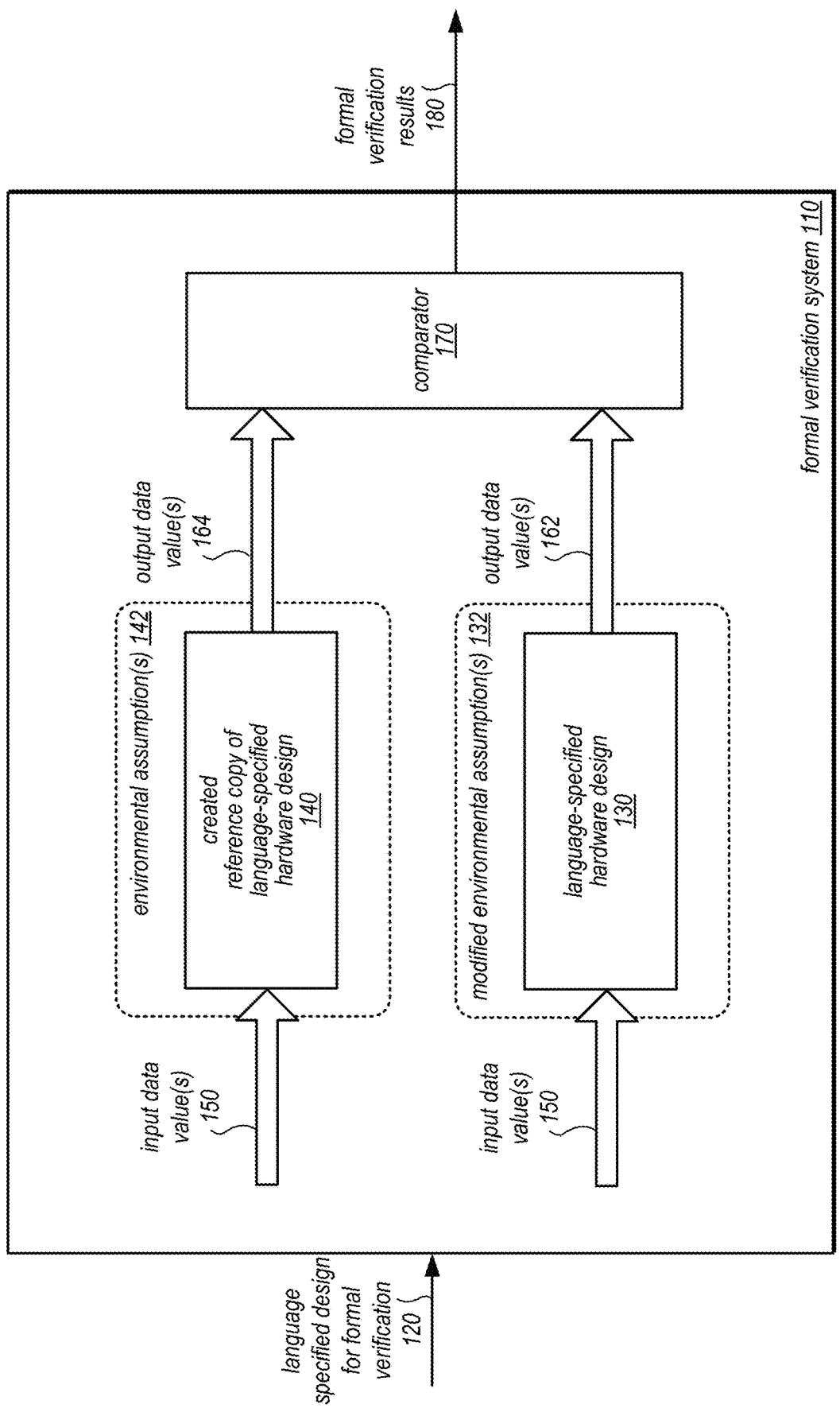
FIG. 1 illustrates a logical block diagram of environmental modification testing for design correctness with formal verification, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various techniques of environmental modification testing for design correctness with formal verification are described herein. While formal verification techniques offer cost effective verification when designing new hardware, not all hardware designs can be fully verified in some scenarios. For instance, the complexity of some hardware designs is beyond the capability of a formal verification technique to completely establish correctness of the design in all scenarios. The environment of a hardware design, for example, may result in timing or ordering changes for inputs to and outputs from a hardware design that could result in error conditions or other performance problems, which may not be able to be verified using the mathematical representations of some formal verification schemes (or may be possible but not be within the processing capacity or practical time constraints for performing formal verification upon the hardware design).

In various embodiments, environmental modification testing for design correctness with formal verification may be implemented to provide formal verification of complex hardware designs that are not otherwise amenable to or capable of being modeled in formal verification systems. Instead, the hardware design itself may serve as the standard for verifying correctness, by comparing the output data values from two instantiations of the hardware design, with one instantiation serving as the reference copy to output values to compare with output values of a hardware design under testing conditions, such as environmental conditions. In this way, flaws or other errors in the hardware design can be detected when the output values determined from the same input but subjected to different environmental conditions do not match. Moreover, such techniques allow for correctness verification without exceeding the capabilities of a formal verification system to perform formal verification to generate the output values of the different instantiations of the hardware design.

FIG. 1 illustrates a logical block diagram of environmental modification testing for design correctness with formal verification, according to some embodiments. A formal verification system, such as formal verification system 110, may perform formal verification techniques on a submitted system described according to a hardware language (e.g., such as hardware description languages like VHDL, Verilog, and RHDL, among others), such as language specified design 120. To perform correctness verification on the language-specified hardware design, a reference copy of the language specified hardware design 140 may be created in addition to the language specified hardware design 130 that is under test. In various embodiments, such as those discussed below with regard to FIGS. 2-6, a verification task (or verification job, program, procedure, or other plan and/or instructions to perform formal verification) may be created that includes both reference copy 140 in addition to the language specified hardware design 130.

As illustrated in FIG. 1, to verify correctness, the same input data value(s) 150 may be provided as part of executing formal verification. Note that in some scenarios the input data values 150 may be provided or processed in the same order (as discussed below with regard to FIG. 3) or provided or processed in a same timing (as discussed below with regard to FIG. 4). The processing of input data values 150 at both reference copy 140 and language-specified hardware design 130 may be determined according to different environmental assumption(s), such as environmental assumption (s) 142 for reference copy 140 and environmental assumption(s) 132 for language-specified hardware design 130. In some embodiments, environmental assumptions may be constraints or other criteria that specify the environment in which the hardware design operates, including the timing environment (e.g., clock or other signal frequencies), ordering of the data signals (e.g., out of order data), the assumed performance of other hardware (e.g., simulated downstream hardware that may back up and thus put back pressure on the hardware design—which may be simulated through timing signals, in some scenarios, as discussed below).

Because the same input data values 150 are processed through the same hardware design operating in different environmental contexts, the agreement of the different hardware designs as to an output value indicates whether the imposition of a different environment (e.g., modified environmental assumption(s) 132) creates erroneous output. Thus as illustrated in FIG. 1, in various embodiments, the output data values 164 of reference copy 140 processing under environmental assumption(s) 142 may be evaluated by comparator 170 with the output data values 162 of language-specified hardware design 130 processing in modified environmental assumption(s) 132. Comparator 170 may, in some embodiments, obtain the output data values from a buffer, such as a first-in-first-out (FIFO) queue for each hardware design copy, in order to compare the corresponding output values with one another. Comparator 170 may implement various data type comparators (e.g., binary, string, integer, etc.) to make the comparison as to whether the output values 164 and 162 match. For non-matching output values, an error indication may be provided as part of formal verification results 180. For matching output values, no indication or a success indication may be provided, in some embodiments, as part of formal verification results 180.

Please note that the previous description of a formal verification system, including the number and/or configuration of hardware designs, comparators, and other interactions is merely provided as an example of environmental modification testing for design correctness with formal verification. Different numbers of components or configuration of components may be implemented.

This specification begins with general descriptions of a system verification application, which may implement environmental modification testing for design correctness with formal verification. Various examples of different components/modules, or arrangements of components/modules that may be implemented in the system verification application may then be discussed. A number of different methods and techniques to implement interactive environmental modification testing for design correctness with formal verification are then discussed, some of which are illustrated in the accompanying flowchart. Various examples are provided throughout the specification.

Figure 2:
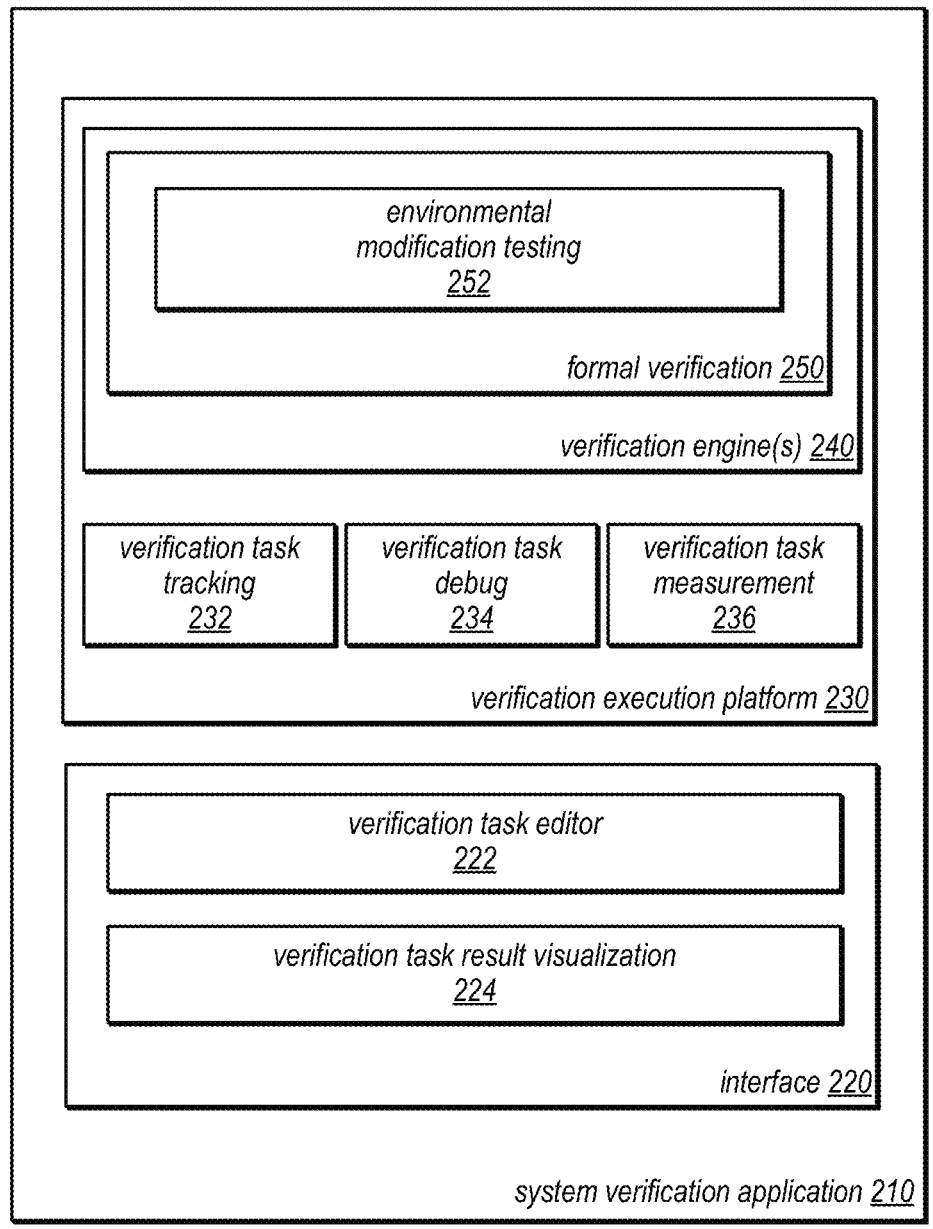
FIG. 2 is a logical block diagram illustrating a system verification application that may implement environmental modification testing for design correctness with formal verification, according to some embodiments.

FIG. 2 is a logical block diagram illustrating a system verification application that may implement environmental modification testing for design correctness with formal verification, according to some embodiments. System verification application 210 may provide a set of verification tools or functions (or may be implemented as part of a larger Integrated Development Environment (IDE)) to perform, among other operations, the development and verification of hardware designs via various verification engine(s) 250 to determine a language-specified hardware design. System verification application 210 may implement various features, such as interface 220 and verification execution platform 230, which may be used to perform various interactive compilation techniques.

For example, interface 220 may be a programmatic interface implementing one or multiple Application Programming Interfaces (APIs) to invoke different operations, including compilation, a GUI interface that provides various visual control elements for editing, compiling, or other development activities, and/or a command line interface, which may also provide command line controls to edit, compile, or perform other development, design, and/or verification activities. In some embodiments, interface 220 may act as a control console that allows for the configuration of system verification application 210 features. For instance, interface 220 may support requests to configure various parameters or options of verification execution platform 230 (or verification engine(s) 240), such as the hardware language, assertions, assumptions, cover features, or other criteria or information for performing various verification techniques, such as for formal verification 250. Like FIG. 5 below, interface 220 may provide input support for editing verification tasks, (including code, scripts, or visual objects that represent the operations of a verification task performed by one of verification engine(s) 240). For example, interface 220 may implement verification task editor 222, which may allow a user to specify various features, criteria, or parameters for different types of verification tasks implemented by different verification engine(s) 240, such as environmental modification testing 252 implemented as part of formal verification 250.

Interface 220 may also implement verification task result visualization 224. Different kinds of verifications, supported by verification engine(s) 240, may result in different types of visualizations for the verification task results. For example, paths through a logical block diagrams may be illustrated to identify a path in a hardware design with an error, or state tables may indicate when erroneous or invalid states are achieved by a hardware design. In at least some embodiments, verification task result visualization 224 may support indicating errors for environmental modification testing 252 (and successes in some embodiments), as discussed above with regard to FIG. 1 and below with regard to FIG. 6.

System verification application 210 may implement a verification execution platform 230, which may support a common feature set (in addition to interface 220) across multiple different types of verifications supported by different verification engines. For instance, verification task tracking 232 may provide a common interface for identifying verification task milestones, estimates, or other tracking features. Verification task debug 234 may implement various debug tools for tracing errors, identifying alternatives or errors proactively (e.g., prior to test), as well as different linking errors in visualizations to error definitions for different verification engine 240 operations, in some embodiments. In some embodiments, verification task measurement 236 may provide performance metrics, benchmarks, or other assessments of hardware designs under verification. As noted above, different types of verification techniques are supported by verification engines 240. For example, verification engine(s) 240 may provide for formal verification 250 and static verification, design simulation verification, design emulation verification, and hardware prototyping (e.g., for FPGAs), among other verification engine(s) 240. As discussed in detail above with regard to FIG. 1 and below with regard to FIGS. 2-6, environmental modification testing 252 may be implemented to determine correctness of a hardware design utilizing a reference copy created of the hardware design and by comparing the respective outputs of the reference copy and original hardware design using formal verification 250.

In various embodiments, the components illustrated in FIG. 2 may be implemented directly within computer hardware, as instructions directly or indirectly executable by computer hardware (e.g., a microprocessor or computer system), or using a combination of these techniques. For example, the components of FIG. 2 may be implemented by a system that includes a number of computing nodes (or simply, nodes) as part of a service, each of which may be similar to the computer system embodiment illustrated in FIG. 7 and described below, in one embodiment. In various embodiments, the functionality of a given system or service component (e.g., a component of development application 210) may be implemented by a particular node or may be distributed across several nodes). In some embodiments, a given node may implement the functionality of more than one service system component (e.g., more than one development application component).

Figure 3:
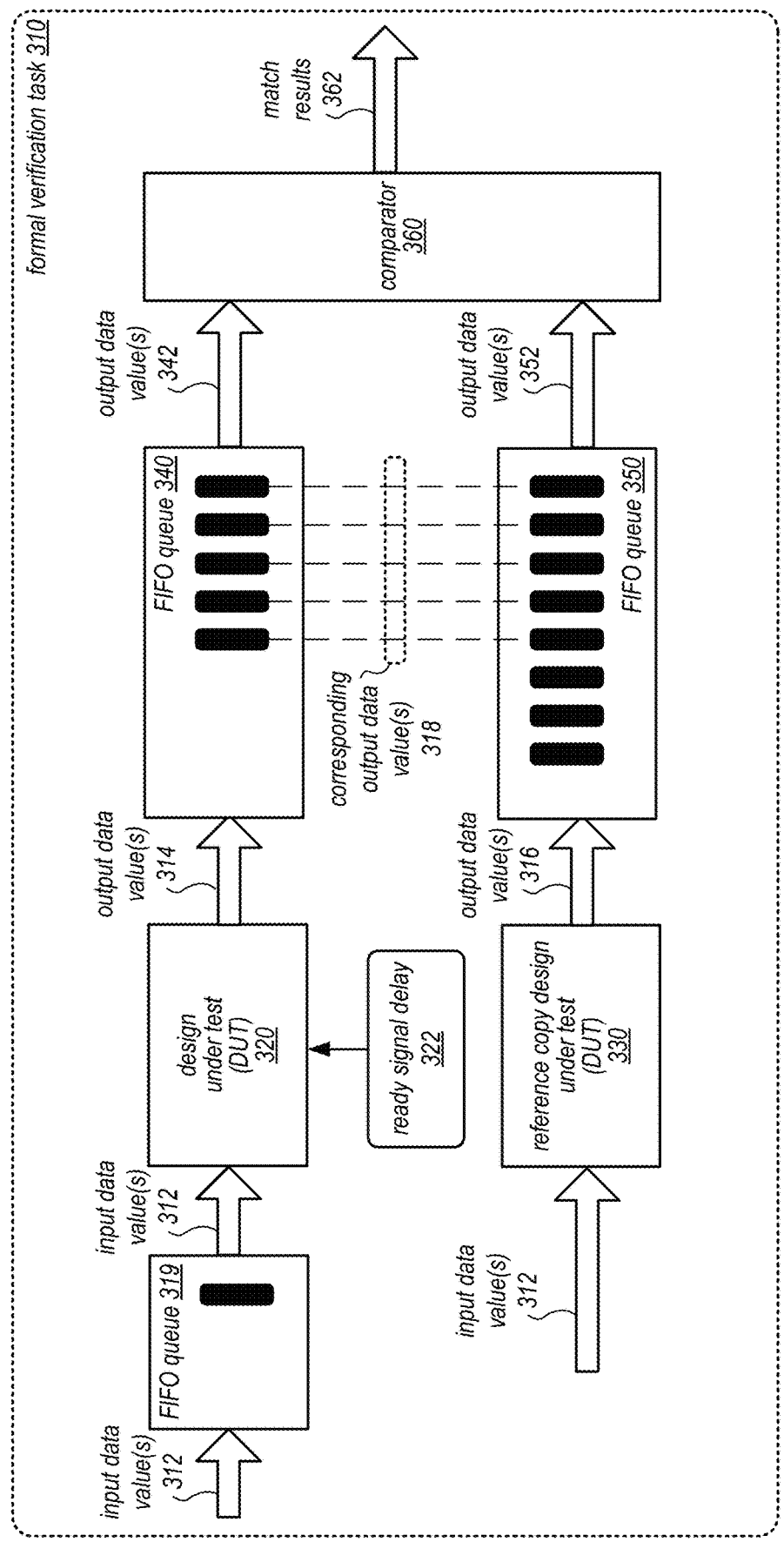
FIG. 3 is a logical block diagram illustrating a verification task created by a system verification application that tests input timing on a design for correctness with formal verification, according to some embodiments.

FIG. 3 is a logical block diagram illustrating a verification task created by a system verification application that tests input timing on a design for correctness with formal verification, according to some embodiments. Formal verification task 310 may be similar to formal verification tasks discussed below with regard to FIGS. 4, 5, and 6, in that it may implement a modification to an environmental assumption to use for correctness analysis. For instance, a received design-under-test (DUT) 320, may be copied to create reference copy DUT 330. To ensure that the output results of DUT 320 and reference copy DUT 330 are received and evaluated in a same order, First-In-First-Out (FIFO) queues, such as FIFO queue 340 and FIFO queue 350. Then, comparator 360 can be provided with ordered output values that pull corresponding output data value(s) 342 from FIFO queue 340 and output data values 352 from FIFO queue 350 to provide match results 362.

As discussed above with regard to FIG. 1, different types of environmental assumptions can be modified in order to perform correctness analysis on DUT 320, to determine whether the conditions caused by the modification to the environmental assumption provoke failures in DUT 320. For example, a timing for delivering or providing input data to DUT 320 or a timing for allowing output values from DUT 320 (e.g., implementing back pressure on features within DUT 320) can be tested, to determine whether some timings provoke an error—that should not provoke an error if DUT 320 is correct. For example, an environmental assumption 322 may provide for a ready signal delay that occurs at randomized (or specified frequencies). In this way, a feature of DUT 320 that depends upon a ready signal (e.g., as part of "valid" and "ready" signal pair that allows for the data to proceed into or out of DUT 320), can be delayed by delaying the assertion of the ready signal. Therefore, the same input data values 312 can be provided to both DUT 320 and reference copy DUT 340. However, backpressure or other timing differences may affect the rate at which input data value(s) 312 can be accepted for processing at DUT 320, and thus FIFO queue 319 may be implemented in some embodiments to hold input data values 312 until DUT 320 can process them. Moreover, the timing at which the respective output values 314 and 316 are provided to FIFO queues 340 and 350 may be different in a back pressure, or other timing modification scenario. However, because FIFO queues 340 and 350 enforce an ordering that matches the corresponding output data values 318 in the same position in the respective queues, comparator 360 may be able to make comparisons on the corresponding output values by pulling the next pair of output data values 342 and 352 from the queues 340 and 350.

Figure 4:
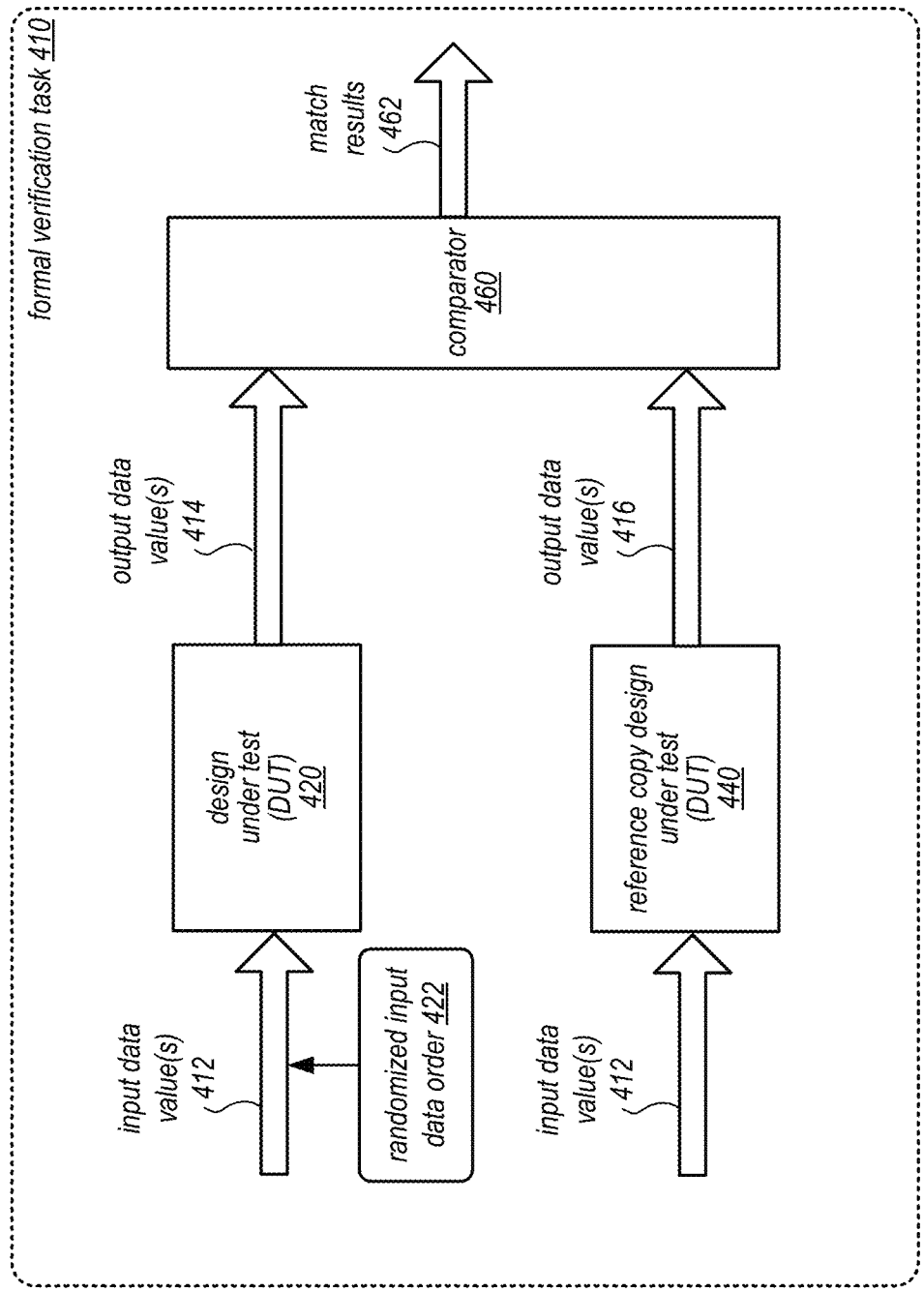
FIG. 4 is a logical block diagram illustrating a verification task created by a system verification application that tests input ordering on a design for correctness with formal verification, according to some embodiments.

FIG. 4 is a logical block diagram illustrating a verification task created by a system verification application that tests input ordering on a design for correctness with formal verification, according to some embodiments. Formal verification task 410 may be similar to formal verification task 410 discussed above in that it may implement a modification to an environmental assumption to use for correctness analysis. For instance, a received design-under-test (DUT) 420, may be copied to create reference copy DUT 440. As other environmental assumptions are being tested (instead of timing) the corresponding output data values 414 and 416 may be provided directly to comparator 460 (although in other embodiments queues similar to the output FIFO queues 340 and 350 in FIG. 3 above may be implemented). Comparator 460 may provide match results 462 in order to determine whether the environmental assumptions, such as randomized input data order 422, affect correctness of DUT 420.

As discussed above with regard to FIG. 1, different types of environmental assumptions can be modified in order to perform correctness analysis on DUT 420, to determine whether the conditions caused by the modification to the environmental assumption provoke failures in DUT 420. For example, an ordering for delivering or providing input data to DUT 420 can be tested, to determine whether some orderings provoke an error—that should not provoke an error if DUT 420 is correct. For example, an environmental assumption 422 may provide for randomized input data order 422. If, for instance, input data 412 is expected to follow some order (e.g., A, then B, then C, then D, and then E), then a randomized input data ordering could invoke one or more multiple reorderings (or all possible reorderings), such as B, C, A, E, D. Therefore, the same input data values 412 can be provided to both DUT 420 and reference copy DUT 440. The respective output data values 414 416 can then be provided to comparator 460.

Figure 5:
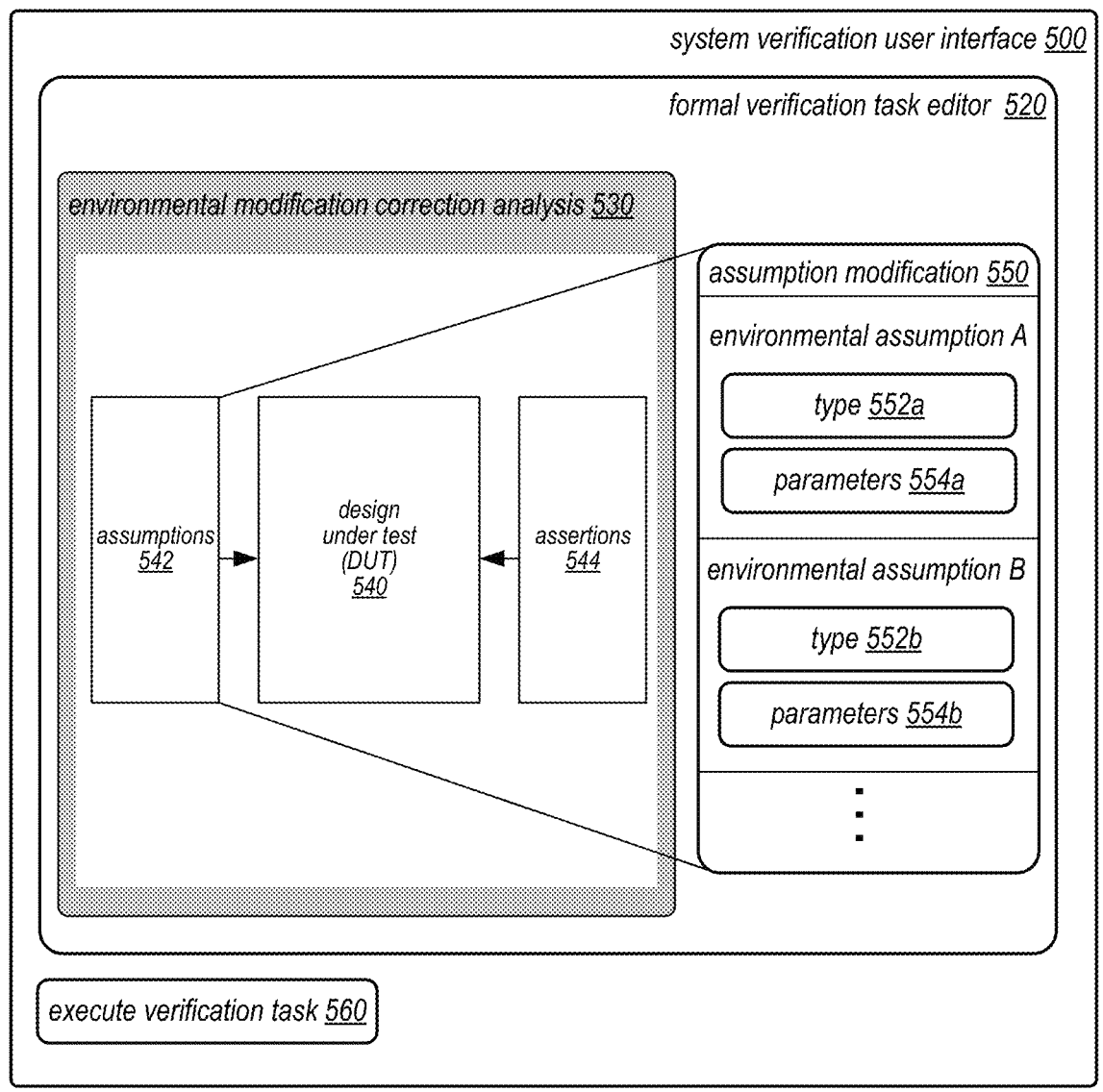
FIG. 5 is an example of an interface for creating a verification task that performs environmental modification testing for design correctness with formal verification, according to some embodiments.

FIG. 5 is an example of an interface for creating a verification task that performs environmental modification testing for design correctness with formal verification, according to some embodiments. System verification user interface 500 may be a graphical user interface implemented as part of interface 220 (e.g., as part of verification task editor 222), in some embodiments, to provide various different interface elements for creating, modifying, and/or executing a verification task that implements environmental modification testing for design correctness using formal verification. For example, formal verification task editor 520 may be implement various menus, buttons, lists, drop-down boxes, selectors, text, inputs, upload mechanisms, and/or other graphical user interface elements to allow a user to create a verification task that can, for instance, perform environmental modification correction analysis, in some embodiments.

Formal verification task editor 520 may implement elements (not illustrated) to create or otherwise begin to specify a verification task. For instance, various templates or other verification task creation workflows may be presented. In some embodiments, an environmental modification correction analysis 530 may be selected for creation, modification, and/or execution. A hardware design, specified according to a hardware language may be uploaded, written or created (e.g. as part of a text editor for creating hardware designs—not illustrated), such as design-under-test (DUT) 540. Different techniques for formal verification may be implemented, in various embodiments. In at least some of these techniques, different assumptions, such as assumptions 542, and different assertions, such as assertions 544, may be implemented for DUT 540.

In some embodiments, a user interface element may be implemented as part of formal verification task editor 520, such as assumption modification element 550, which may offer interface elements to specify environmental assumptions for performing environmental modification correction analysis 530. For example, environmental assumption A may have a type 552*a* input and parameters 554*a* input. Similarly, environmental assumption B may have a type 552*b* input and parameters 554*b* input. Different types of environmental assumptions may be selected, such as an environmental assumption that controls timing, like the backpressure example discussed above with regard to FIG. 3, or input data order, as discussed above with regard to FIG. 4. Parameter values for the different types of environmental assumption. For instance, different types of timing schemes may be implemented, and thus may be specified with different parameters, such as randomized timing features or timing expressed in terms of a clock cycle pattern, or other pattern/frequency.

As indicated at 560, a user interface element may be implemented to cause the execution of the verification task that performs environmental modification correction analysis 530. For example, the execution of the verification task may be performed to instantiate or otherwise create a reference copy of DUT 540 using the same assumptions 542 and assertions 544, with the exception of those assumptions that are modified (instead the unmodified assumptions may be used). Although not illustrated, a user interface may implemented to provide results after causing the execution of the verification task via element 560 (e.g., as a pop-up window or result display, by identifying or downloading a result file, and so on).

The examples discussed above with regard to FIGS. 1-5 have been given in regard to an example system verification application. Note that various other types or configurations of applications, including hardware development applications, may implement environmental modification testing for design correctness with formal verification and thus may implement these techniques. In addition to examples given above, the techniques discussed below with regard to FIG. 6 may be also implemented using the various components discussed above as well as different types of systems or devices that compile source code for software to be executed on a hardware design.

Figure 6:
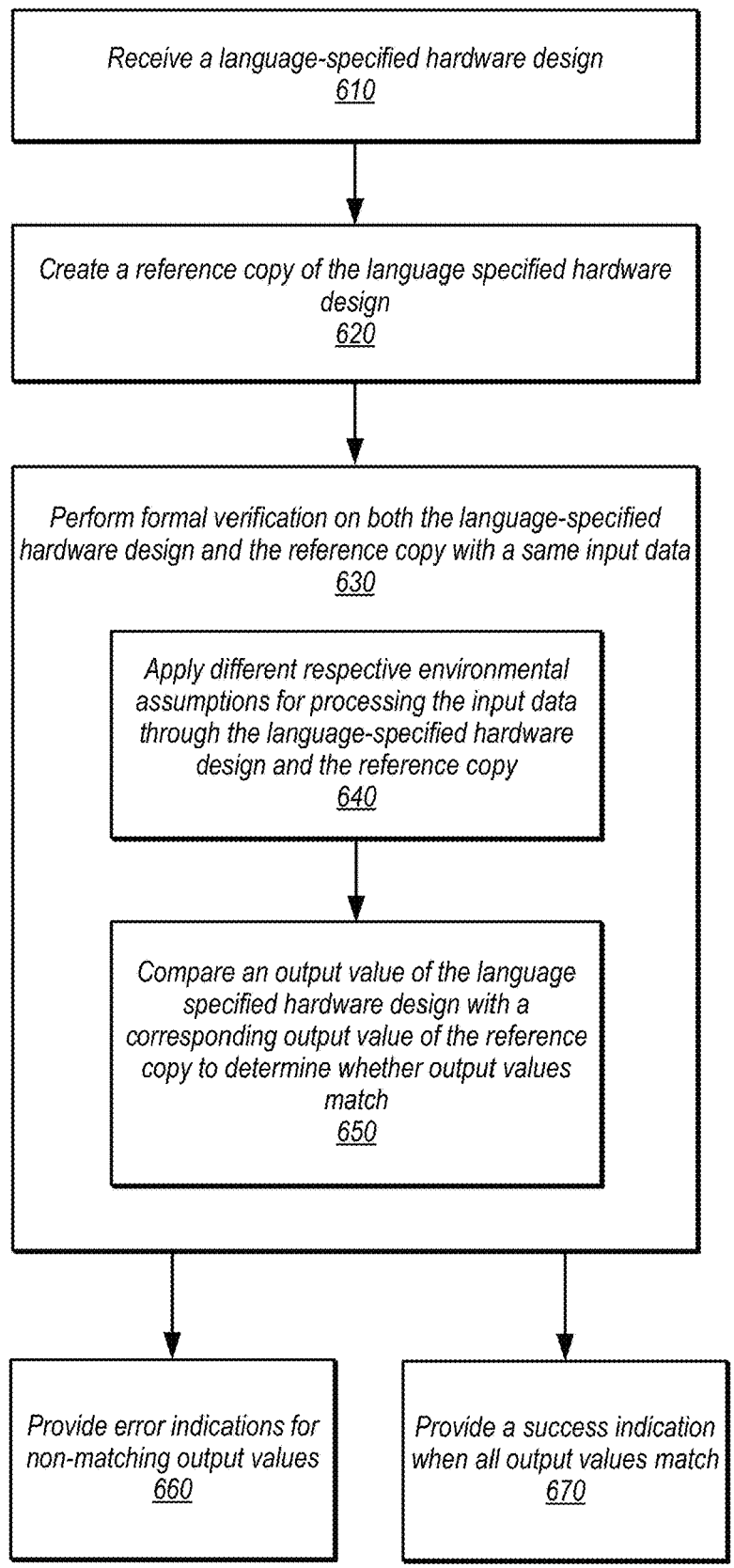
FIG. 6 is a high-level flowchart illustrating various methods and techniques to implement environmental modification testing for design correctness with formal verification, according to some embodiments.

FIG. 6 is a high-level flowchart illustrating various methods and techniques to implement environmental modification testing for design correctness with formal verification, according to some embodiments. As indicated at 610, a language-specified hardware design may be received, in various embodiments. For example, the hardware design may be specified according to a hardware language like System Verilog or VHSIC Hardware Definition Language (VHDL). The language-specified hardware design may be stored in a file, data object, data structure, or other portion of data that supports storing a language-specified hardware design, in some embodiments. In various embodiments, verification system may accept as a single verification task, job, or operation, the hardware design as part of a request to create, execute, initiate, or otherwise perform formal verification on the hardware design. As discussed above (e.g., with regard to FIGS. 1, 2, and 5), a request may be a request to perform the design correctness analysis for formal verification with environmental modifications). In some embodiments, a verification system library may implement or support a request as part of a script or other programmatic invocation (e.g., test code or other instructions for testing the language-specified hardware design) to perform the design correctness analysis (e.g., a function call to perform correctness analysis with supplied parameters for the different environmental assumptions).

As indicated at 620, in some embodiments, a reference copy of the language specified hardware design may be created. For example, the language-specified hardware may be a design-under-test (DUT) which may include specified inputs or criteria (e.g., assumptions and assertions as illustrated in FIG. 5), for performing formal verification on the language-specified hardware design. The reference copy may include the same specified inputs, criteria, or other features as the language-specified hardware design. In this way, the reference copy may be used as a true value generator, in some embodiments, which may provide a correct result for comparison with the language-specified hardware design being subject to test conditions, like different environmental assumptions. As discussed above, the reference copy may be included in a task, script, document, or other file that provides instructions or other information to a verification system to perform formal verification.

As indicated at 630, formal verification may be performed on both the language-specified hardware design and the reference copy with a same data input, in various embodiments. For instance, formal verification may be begun in response to a request to execute or start formal verification of verification task that includes both the language specified-hardware design and the reference copy. In some embodiments, the verification task may include instructions or criteria that specifies how performance of both the reference copy and the language-specified hardware design is to be carried (e.g., similar to the logical block diagrams illustrated in FIGS. 3 and 4 above), including how output values of the reference copy and the language-specified hardware design are to be handled for evaluation (e.g., to FIFO queues).

Various formal verification techniques may be performed to implement formal verification for both the reference copy and the language-specified hardware design, in some embodiments. For example, some formal verification techniques may utilize inputs and/or internal variables for the hardware design being tested (e.g., the reference copy and the language-specified hardware design) have some constraints which may be specified by one or more assumptions (including environmental assumptions) and one or more checks for validity on outputs or internal variables of the hardware design being tested specified by one or more assertions, in some embodiments. Formal verification techniques may translate or represent the assumptions, assertions, and other aspects of the reference copy and the language-specified hardware design as mathematical equations which can then be analyzed to identify if there is a sequence that creates a scenario that violates an assertion.

As part of performing formal verification, different respective environmental assumptions for processing the input data through the reference copy and the language-specified hardware design may be applied, in some embodiments. For example, as discussed above with regard to FIG. 3, different timing, including back pressure, can be introduced as an assumption by specifying timing changes as to when input data can be accepted and processed or output. Similarly, other environmental assumptions that deviate from a perfect or normal operation for the hardware design may be applied (e.g., a different ordering of input data values, as data can arrive out of order in some circumstances). In various embodiments, the reference copy may be analyzed using "normal" or non-altered assumptions (e.g., that do not attempt to provoke specific error conditions or problematic workloads). In various embodiments, modified assumptions may be applied to the language-specified hardware design.

As indicated at 650, an output value of the language-specified hardware design and an output value of the reference copy may be compared, in various embodiments, to determine whether the output values match. In at least some embodiments, a FIFO or other data structure that enforces ordering may be implemented to hold each output result so that the corresponding output values may be identified as both being in the same position in the ordering of output values.

As indicated at 660, error indications may be provided for non-matching output values, in some embodiments. For instance, an assertion or other condition or criteria that did not succeed as a result of the different environmental assumptions may be identified, to provide notice to a designer where a problem in the design may be found, in some embodiments. As indicated at 670, success indications may be provided when all output values match, in some embodiments. For instance, an assertion or other condition or criteria that did succeed as a result of the different environmental assumptions may be identified, to provide notice to a designer where a design is successful, in some embodiments.

The techniques discussed above with regard to FIG. 6, may be implemented for multiple types of environmental assumptions. In some embodiments, different environmental assumptions may be applied to another copy of the language-specified hardware design, which also may have its respective output compared with the reference copy to identify another error for another type of condition. In some embodiments, multiple different assumptions could be modified for the one of the hardware designs (e.g., the language-specified hardware design) that different from the other (e.g., multiple different assumptions than those used to analyze the reference copy).

Various ones of the methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

Figure 7:
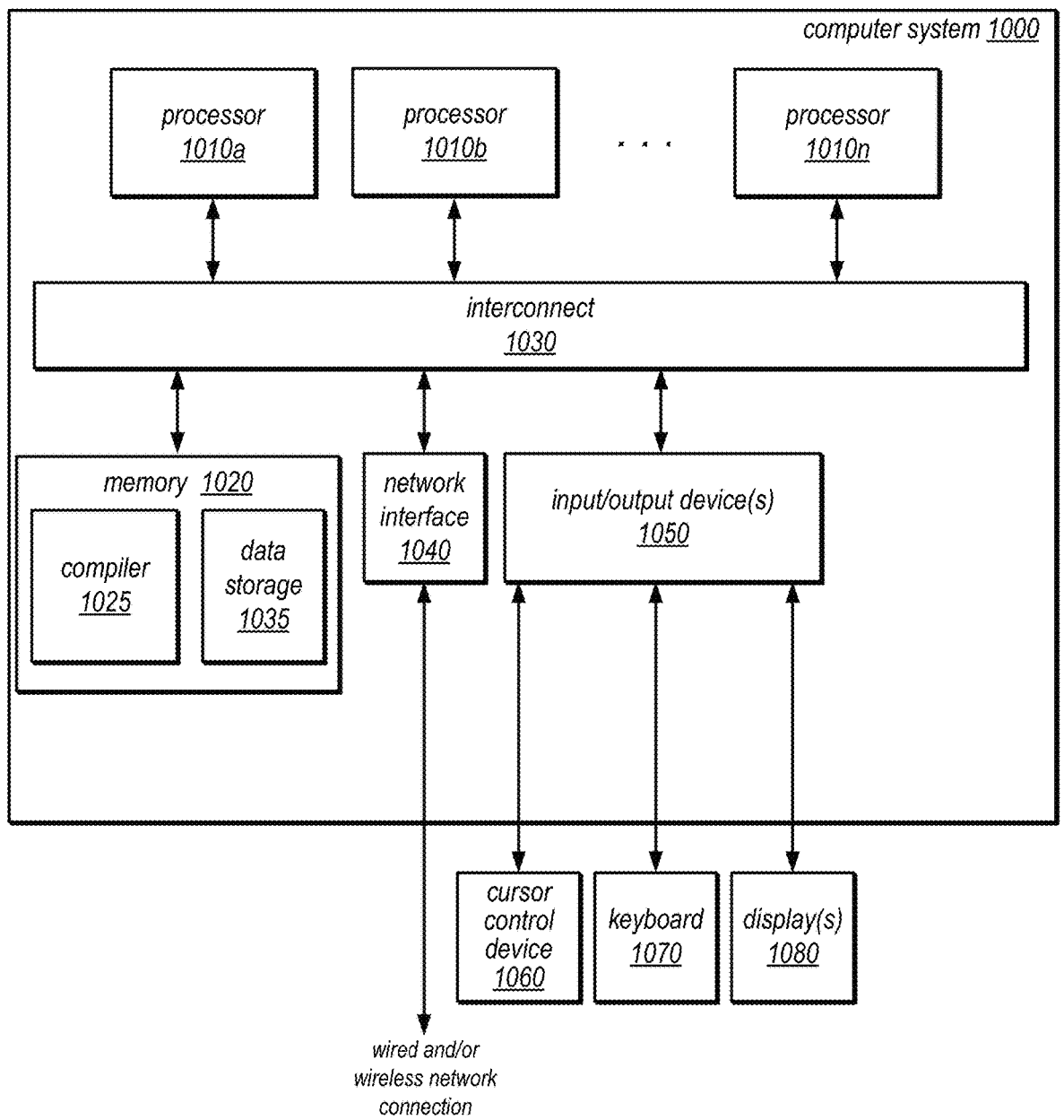
FIG. 7 is an example computer system, according to some embodiments.

Embodiments of environmental modification testing for design correctness with formal verification as discussed above may be implemented as part of a computer system. One such computer system is illustrated by FIG. 7. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing node, compute node, computing device, compute device, or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions that execute on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 1020 as program instructions, such as program instructions to implement a compiler 1025 (like compiler 240 discussed above with regard to FIG. 2 as well as other features or all of development application 210) and data storage 1035, respectively. In other embodiments, program instructions and/or data may be received, sent or stored upon different types of computer-accessible media or on similar media separate from system memory 1020 or computer system 1000. Generally speaking, a non-transitory, computer-readable storage medium may include storage media or memory media such as magnetic or optical media, e.g., disk or CD/DVD-ROM coupled to computer system 1000 via I/O interface 1030. Program instructions and data stored via a computer-readable medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

Those skilled in the art will appreciate that computer system 1000 is merely illustrative and is not intended to limit the scope of the techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a non-transitory, computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
   one or more processors;
   a memory, storing program instructions that, when executed by the one or more processors, cause the one or more processors to implement a verification system, the verification system configured to:
   receive a request to create a formal verification task that verifies correctness of an environmental modification for processing data through a language-specified hardware design;
   create the formal verification task, wherein to create the formal verification task the verification system is configured to:
     create a reference copy of the language-specified hardware design in the formal verification task;
     specify a modification to an environmental assumption for processing input data through the language-specified hardware design that is not applied to the environmental assumption for the reference copy when processing the same input data through the reference copy;
     specify a comparison of an output value of the language-specified hardware design with a corresponding output value of the reference copy to determine whether the output values, namely the output value of the language-specified hardware design and the corresponding output value of the reference copy, match; and
   execute the formal verification task; and
   in response to a determination that said output values do not match, provide an error indication for the language-specified hardware design.

2. The system of claim 1, wherein the modification to the environmental assumption changes a timing for allowing output of the language-specified hardware design that delays an output value from the language-specified hardware design to create a back pressure in the language-specified hardware design.

3. The system of claim 1, wherein the modification to the environmental assumption changes an ordering of items within the input data when processed through the language-specified hardware design.

4. The system of claim 1, wherein the verification system is further configured to:
   receive a request to create a second formal verification task that verifies correctness of an environmental modification for processing data through a second language-specified hardware design;
   create the second formal verification task, wherein to create the second formal verification task the verification system is configured to:
     create a second reference copy of the second language-specified hardware design in the second formal verification task;
     specify a modification to an environmental assumption for processing other data through the second language-specified hardware design that is not applied to the environmental assumption for the second reference copy when processing the other data through the second reference copy;
     specify a comparison for each output value of the second language-specified hardware design with each corresponding output value of the second reference copy to determine whether the output values match; and
   execute the second formal verification task; and
   in response to a determination that each of the output values of the second verification task match, provide a success indication for the second language-specified hardware design.

5. A method, comprising:
   receiving, at a verification system, a language-specified hardware design for testing;
   creating, by the verification system, a reference copy of the language-specified hardware design;
   performing, by the verification system, a formal verification on both the language-specified hardware design and the reference copy with a same input data, the performing comprising:
     applying different respective environmental assumptions for processing the same input data through the language-specified hardware design and the reference copy;
     comparing an output value of the language-specified hardware design with a corresponding output value of the reference copy to determine whether the output values, namely the output value of the language-specified hardware design and the corresponding output value of the reference copy, match; and
   in response to determining that the output values do not match, providing, by the verification system, an error indication for the language-specified hardware design.

6. The method of claim 5, further comprising receiving, by the verification system, a specified modification to make the different respective environmental assumptions for processing the same input data through the language-specified hardware design and the reference copy via a user interface for the verification system.

7. The method of claim 6, wherein the specified modification changes a timing for processing the input data through the language-specified hardware design.

8. The method of claim 7, wherein the specified modification randomizes signaling of a ready signal for the language-specified hardware design.

9. The method of claim 7, wherein the specified modification specifies signaling of a ready signal for the language-specified hardware design according to a clock cycle pattern.

10. The method of claim 6, wherein the specified modification changes an ordering of items within the input data when processed through the language-specified hardware design.

11. The method of claim 5, wherein the comparing the output value of the language-specified hardware design with the corresponding output value of the reference copy to determine whether the output values match comprises obtaining the output value of the language-specified hardware design from a first first-in-first-out (FIFO) queue that stores output data values of the language-specified hardware design and obtaining the output value of the reference copy from a second FIFO queue that stores output data values of the reference copy.

12. The method of claim 5, wherein the applying different respective environmental assumptions for processing the input data through the language-specified hardware design and the reference copy comprises applying more than one type of different environmental assumption to the language-specified hardware design.

13. The method of claim 5, further comprising:
receiving, at the verification system, a second language-specified hardware design for testing;
creating, by the verification system, a second reference copy of the second language-specified hardware design;
performing, by the verification system, a formal verification on both the second language-specified hardware design and the second reference copy with other input data, comprising:
applying different respective environmental assumptions for processing the other input data through the second language-specified hardware design and the second reference copy;
comparing each output value of the second language-specified hardware design with each corresponding output value of the second reference copy to determine whether the output values, namely the each output value of the second language-specified hardware design and the each corresponding output value of the second reference copy, match; and
in response to determining that the each output value and the each corresponding output value match, providing, by the verification system, a success indication for the second language-specified hardware design.

14. One or more non-transitory, computer-readable storage media, storing program instructions that, when executed on or across one or more computing devices, cause the one or more computing devices to implement at least:
receiving a language-specified hardware design for testing;
creating a reference copy of the language-specified hardware design;
causing execution of a formal verification for the language-specified hardware design and the reference copy with a same input data for both the language-specified hardware design and the reference copy, wherein in causing execution of a formal verification, the program instructions cause the one or more computing devices to implement:
modifying an environmental assumption for processing the input data through the language-specified hardware design that is not applied to the reference copy when processing the input data through the reference copy;
comparing an output value of the language-specified hardware design with a corresponding output value of the reference copy to determine whether the output values, namely the output value of the language-specified hardware design and the corresponding output value of the reference copy, match; and
in response to determining that the output values do not match, providing an error indication for the language-specified hardware design.

15. The one or more non-transitory, computer-readable storage media of claim 14, wherein the modifying the environmental assumption changes a timing for processing the input data through the language-specified hardware design.

16. The one or more non-transitory, computer-readable storage media of claim 14, wherein a modification to the environmental assumption changes an ordering of items within the input data when processed through the language-specified hardware design.

17. The one or more non-transitory, computer-readable storage media of claim 14, further storing additional program instructions that when executed on or across the one or more computing devices, cause the one or more computing devices to further implement receiving a specified modification to make a modification to the environmental assumption for processing the input data through the language-specified hardware design and the reference copy via a user interface for the verification system.

18. The one or more non-transitory, computer-readable storage media of claim 14, wherein, in comparing the output value of the language-specified hardware design with the corresponding output value of the reference copy to determine whether the output values match, the program instructions cause the one or more computing devices to implement obtaining the output value of the language-specified hardware design from a first first-in-first-out (FIFO) queue that stores output data values of the language-specified hardware design and obtaining the output value of the reference copy from a second FIFO queue that stores output data values of the reference copy.

19. The one or more non-transitory, computer-readable storage media of claim 14, further storing additional program instructions that, when executed on or across the one or more computing devices, cause the one or more computing devices to further implement:
modifying a second environmental assumption for processing the input data through the language-specified hardware design that is not applied to the reference copy when processing the input data through the reference copy.

20. The one or more non-transitory, computer-readable storage media of claim 14, further storing additional program instructions that, when executed on or across the one or more computing devices, cause the one or more computing devices to further implement:
   receiving a second language-specified hardware design for testing;
   creating a second reference copy of the second language-specified hardware design;
   causing execution of a formal verification for the second language-specified hardware design and the second reference copy with other input data for both the second language-specified hardware design and the second reference copy, wherein in causing the execution of a formal verification, the program instructions cause the one or more computing devices to implement:
      modifying an environmental assumption for processing the other input data through the second language-specified hardware design that is not applied to the second reference copy when processing the other input data through the second reference copy;
      comparing each output value of the second language-specified hardware design with a corresponding output value of the second reference copy to determine whether the output values, namely the each output value of the second language-specified hardware design and the corresponding output value of the second reference copy, match; and
   in response to determining that the output values match, providing a success indication for the second language-specified hardware design.

\* \* \* \* \*